(12) United States Patent
Seto et al.

(10) Patent No.: US 7,961,487 B2
(45) Date of Patent: Jun. 14, 2011

(54) POWER CONVERTER DEVICE

(75) Inventors: Sadashi Seto, Hitachinaka (JP); Shinichi Fujino, Mito (JP)

(73) Assignee: Hitachi, Ltd., Tokyo (JP)

( * ) Notice: Subject to any disclaimer, the term of this patent is extended or adjusted under 35 U.S.C. 154(b) by 421 days.

(21) Appl. No.: 12/142,907

(22) Filed: Jun. 20, 2008

(65) Prior Publication Data

US 2008/0316710 A1 Dec. 25, 2008

(30) Foreign Application Priority Data

Jun. 20, 2007 (JP) ................. 2007-162812

(51) Int. Cl.
*H02M 7/00* (2006.01)
(52) U.S. Cl. .................. 363/132; 257/E25.03
(58) Field of Classification Search ............ 363/16–20, 363/89, 95, 97, 98, 131, 132, 127; 318/781–784, 318/794
See application file for complete search history.

(56) References Cited

U.S. PATENT DOCUMENTS

| | | | |
|---|---|---|---|
| 5,543,659 A | 8/1996 | Hosen | |
| 5,773,883 A | 6/1998 | Majumdar et al. | |
| 6,181,590 B1 * | 1/2001 | Yamane et al. | 363/132 |
| 2007/0109715 A1 | 5/2007 | Azuma et al. | |

FOREIGN PATENT DOCUMENTS

| | | |
|---|---|---|
| EP | 0 633 609 A2 | 1/1995 |
| GB | 2 283 376 A | 5/1995 |
| JP | 2-290098 A | 11/1990 |
| JP | 7-122708 A | 5/1995 |
| JP | 9-191659 A | 7/1997 |
| JP | 10-56131 A | 2/1998 |
| JP | 2000-77602 A | 3/2000 |
| JP | 2002-17092 A | 1/2002 |
| JP | 2002-136171 A | 5/2002 |
| JP | 2002-291261 A | 10/2002 |
| JP | 2003-299366 A | 10/2003 |
| JP | 2006-165409 A | 6/2006 |
| JP | 2007-143272 A | 6/2007 |

OTHER PUBLICATIONS

Chinese Office Action dated Apr. 1, 2010 including English-language translation (Nine (9) pages).

* cited by examiner

*Primary Examiner* — Rajnikant B Patel
(74) *Attorney, Agent, or Firm* — Crowell & Moring LLP

(57) ABSTRACT

A power module having three unit power modules and a control circuit board including a gate drive circuit are set up side by side and mounted on a heat exchanger. A pair of positive and negative direct current terminals for connecting the smoothing capacitor and a plurality of alternating current terminals for inputting and outputting polyphase alternating current are integrally-molded into a power module case of the power module. A plurality of control pins for providing switching devices mounted on the unit power modules with control signals are set up on the opposite side of the side where the direct current terminals and the alternating current terminals are set up, which is figured as located in the right of the drawing. The control pins of the switching devices of the unit power modules and the gate signal output terminals of the control circuit board are wire-bonded. The smoothing capacitor is mounted on the side or top of the power module.

7 Claims, 15 Drawing Sheets

POWER CONVERTER DEVICE

INCORPORATION BY REFERENCE

The disclosure of the following priority application is herein incorporated by reference:
Japanese Patent Application No. 2007-162812 filed Jun. 20, 2007

BACKGROUND OF THE INVENTION

1. Field of the Invention

The present invention relates to a modularized power converter device wherein power semiconductors and control circuit devices are mounted on a circuit board, in particular, a power converter device to be installed in a vehicle.

2. Description of Related Art

These days, electric vehicles including hybrid cars come under the spotlight from the viewpoint of energy saving and prevention of air pollution. An alternating current electric motor, such as an induction motor, a synchronous motor, etc., is mainly adopted for a driving motor. Therefore, a power converter device called inverter, which converts direct current power that is supplied through a power battery into alternating current power, is necessary.

A hybrid car having such a power converter device will be described with reference to FIG. 14.

FIG. 14 shows a hybrid car 50, in which driving force by an alternating current dynamotor 35 is designed to be added to running driving force by an engine 30. The driving force by the engine 30 is transmitted from a transmission 31 to front wheels 33A and 33B through axles 32A and 32B; consequently, the front wheels 33A and 33B are rotary-driven, and the vehicle runs. The driving force by the alternating current dynamotor 35 is transmitted to a crankshaft of the engine 30, and added to the driving force by the engine 30.

This example describes a front-wheel drive vehicle, in which the front wheels 33A and 33B are driven by the engine 30. However, rear wheels may be configured to be driven by the engine. This system is also applicable to vehicles having six or more wheels such as a truck or tow vehicles such as a trailer.

The alternating current dynamotor 35, which is a motor generator (M/G), is, together with the engine 30, installed in an engine room, and connected to the crankshaft of the engine 30 using a belt 34. A power converter device 29 is connected to the alternating current dynamotor 35. Both a power battery 36 with voltage of, for example, 42V and a common in-vehicle battery 38 with voltage of 12V are connected to the power converter device 29.

The power battery 36 is a power supply for driving vehicles. The in-vehicle battery 38 is a power supply for driving accessories such as lights, air conditioners, etc. Hence, a winding field type three-phase alternating current electric rotating machine, for example, is used for the alternating current dynamotor 35. This enables electrical operation and electrical power generation at voltage of, for example, 42V, which is higher than that of a common in-vehicle battery.

The power converter device 29 works as a converter (power rectifier) when the alternating current dynamotor 35 is driven by the engine 30 and performs electrical power generation; while the power converter device 29 works as an inverter (reverse converter) when the alternating current dynamotor 35 works as a rotating electrical machine. When the power converter device 29 works as a converter, each battery is charged: the power battery 36 is provided with direct current power of 42V; while, the in-vehicle battery 38 is provided with direct current power of 12V. On the other hand, when the power converter device 29 works as an inverter, the direct current power of 42V, which is provided from the power battery 36, is converted into alternating current power with a predetermined voltage and a predetermined frequency, and is supplied to the alternating current dynamotor 35.

FIG. 15 shows an example of a circuit configuration of the power converter device 29. The power converter device 29 has a power module 290, which is connected to the power battery 36 or the in-vehicle battery 38 through a main circuit wiring 31. The power module 290, which is provided with semiconductor switching devices, performs switching operations by gate drive signal sent from a control circuit which is not figured herein. The power module 290 works as an inverter, that is, converting the direct current power supplied from the power battery 36 or the in-vehicle battery 38 into three-phase alternating current power with variable frequency, and supplying the current power to the alternating current dynamotor 35 through output wirings 32 of UVW phase.

When the alternating current dynamotor 35 performs the electrical power generation, the power converter device 29 works as a converter, which converts generated three-phase alternating current power into the direct current power, and charges the power battery 36 or the in-vehicle battery 38.

An electrolytic capacitor 20, which is connected to a direct current side of the power module 290, inhibits voltage variation of the direct current voltage caused by the switching operation of the semiconductor switching device of the power module 290.

The operation of the power converter device 29 is executed by a computerized control device which is not figured herein in accordance with a vehicle condition or a driver's operational state. As a result, the hybrid car 50 has a constant and precise running condition, an idling stop function, and a regenerative brake function, which lead to improvement of fuel consumption.

In accordance with this example, the motor generator 35 is connected to the engine 30 with the belt 34. However, other connecting means such as using a chain, etc. is applicable. The motor generator 35 may be configured between the engine 30 and the transmission 31, or may be configured in the transmission 31.

A heretofore known document which discloses such a hybrid car includes Japanese Laid Open Patent Publication No. 2002-136171 (patent document 1). A heretofore known document which discloses a power converter device includes U.S. Pat. No. 5,543,659 (patent document 2) and Japanese Laid Open Patent Publication No. 2006-165409 (patent document 3).

As described above, a power converter device, which is an important component of hybrid cars, etc., is supposed to supply electric power not only to a motor for driving but also to other electrical components such as an air conditioner. A recent increase in demand for vehicle's upgrade in performance and comfort brings about a steady increase in electrical energy in the in-vehicle power converter device.

Since vehicles are reduced in size and weight, a reduction of the power converter device, particularly that for in-vehicle purpose, in size and weight becomes an important issue. The in-vehicle power converter device, in comparison with that for industrial use, etc., is usually used in an environment with a significant temperature change; therefore, high reliability is required to be realized even in an extreme environment with as much power capacity and reduction in size and weight as possible.

In case of the vehicle, a lot of electronic devices (microcomputers) are usually used for engine control, vehicle running control, etc. Although these electronic devices are, in general, susceptible to electrical noise, they are supposed to be equipped inside the vehicle, which is a relatively small space, together with the power converter device. Consequently, in consideration of noise inhibition, the in-vehicle power converter device needs to be configured not to be a source of noise.

The present invention is to provide the power converter device which fulfills specifications for in-vehicle use.

SUMMARY OF THE INVENTION

A power converter device according to a first aspect of the present invention includes: a substantially rectangular power module on which a plurality of switching devices are mounted; a substantially rectangular control circuit board on which a drive circuit of the switching devices is mounted; a heat exchanger on which the power module is mounted; and a smoothing capacitor, wherein: the power module comprises a pair of positive and negative direct current terminals for connecting with the smoothing capacitor, a plurality of alternating current terminals for inputting and outputting polyphase alternating current, and a plurality of control pins for providing the switching devices with control signals; the direct current terminals and the alternating current terminals are set up in an array at one of four sides of the power module; the control pins are set up at an opposite side of the side at which the direct current terminals and the alternating current terminals are set up; and the control circuit board comprises a gate signal output terminal at one of its end edges, and the end edge at which the gate signal output terminal is set up is placed side by side next to the power module, bordering with the side at which the control pins of the power module are set up.

According to a second aspect of the present invention, in the power converter device according to the first aspect, it is preferable that the power module and the control circuit board are arranged not to overlap with each other.

According to a third aspect of the present invention, in the power converter device according to the first aspect, the alternating current terminals may be set up between the pair of positive and negative direct current terminals.

According to a fourth aspect of the present invention, in the power converter device according to the first aspect, the control pins of the power module and the gate signal output terminal of the control circuit board may be connected using bonding wires.

According to a fifth aspect of the present invention, in the power converter device according to the first aspect, it is preferable that the plurality of the switching devices are arranged in a line.

According to a sixth aspect of the present invention in the power converter device according to the fourth aspect, the control circuit board may be fixed to the heat exchanger using an adhesive agent.

According to a seventh aspect of the present invention, in the power converter device according to the third aspect, it is preferable that the pair of positive and negative direct current terminals and the alternating current terminals are, at least partially, configured in a layer structure.

According to a eighth aspect of the present invention, in the power converter device according to the fourth aspect, the bonding wires and a connecting part using the bonding wires, may be sealed using an insulating resin.

According to a ninth aspect of the present invention, in the power converter device according to the first aspect, it is preferable that the switching devices are divided into each phase of polyphase alternating current to be configured as an unit power module of each phase.

According to a tenth aspect of the present invention, in the power converter device according to the ninth aspect, each of the unit power modules may include a wiring connecting section of a power system and a wiring connecting section of a signal system, which are isolated on an insulated metal substrate.

According to a eleventh aspect of the present invention, in the power converter device according to the first aspect, the smoothing capacitor may be disposed one of at a side and on a top of the power module.

In accordance with the present invention, the cost is reduced since electrical connecting pins are unnecessary; while, high reliability is gained since soldering on a back side of a board is unnecessary.

In accordance with the present invention, exchange of capacitors is easy: this improves the reliability and reduces the operating cost.

DESCRIPTION OF PREFERRED EMBODIMENTS

Figure 1:
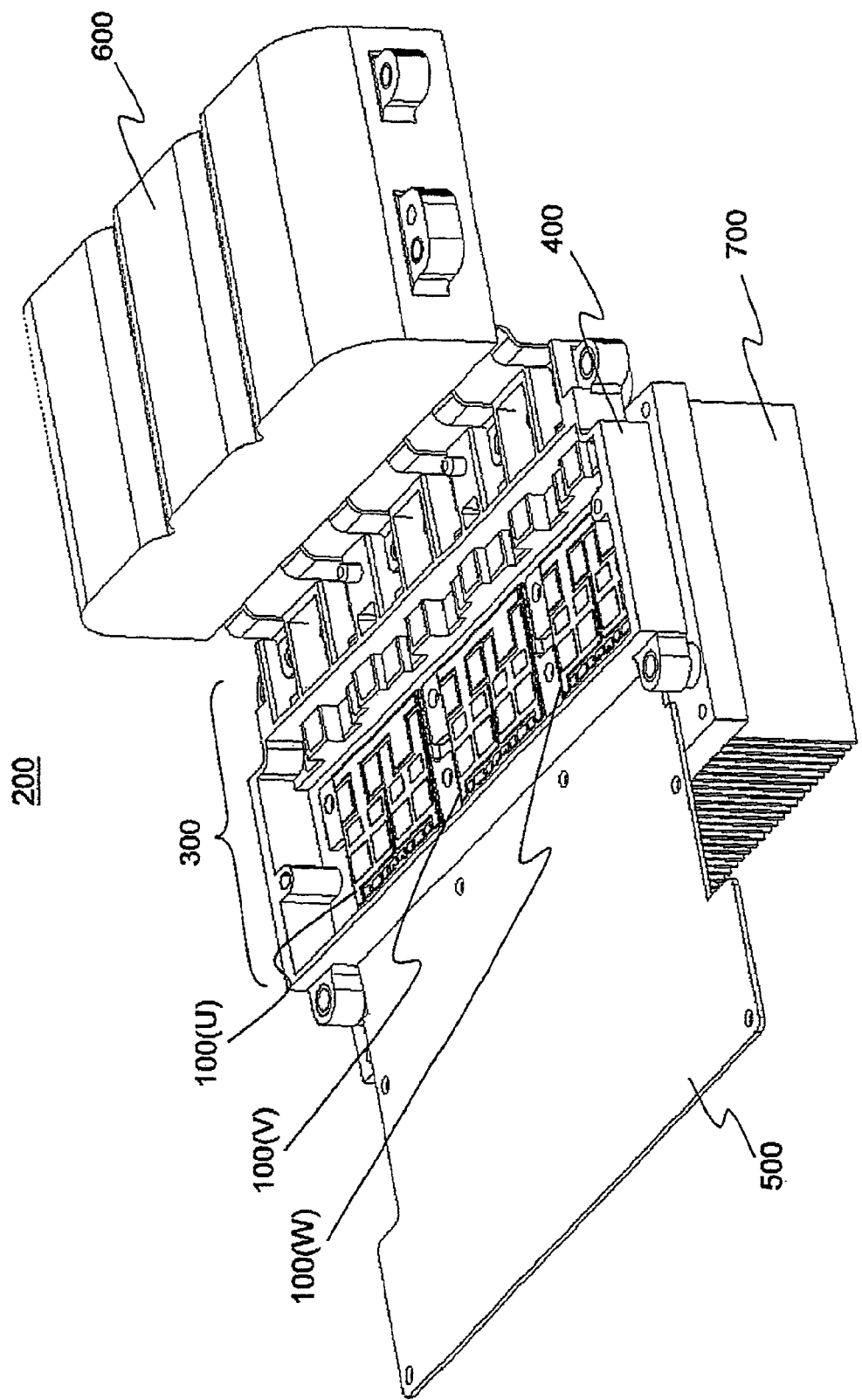
FIG. 1 is a perspective view of a power converter device in accordance with an embodiment of the present invention.

Hereinafter, a power converter device according to an embodiment of the present invention will be described referring to the drawings.

FIG. 1 shows the power converter device 200 that relates to an embodiment of the present invention, wherein: 300 represents a power module; 400 represents a power module case; 500 represents a control circuit board which includes a gate drive circuit; 600 represents a capacitor; and 700 represents a heat exchanger.

The power module 300 is housed in the power module case 400, which is made from high performance resin such as PPS (polyphenylene sulfide). The heat exchanger 700 is mounted on a radiating surface, which is at the bottom of the power module 300, so as to be thermally connected with the power module. The power module 300 is, as figured, made up with three unit power modules 100 (100U, 100V, 100W), wherein letters U, V, and W represent each phase of three-phase alternating current.

The control circuit board 500, which includes the gate drive circuit, is placed side by side next to the power module 300. The control circuit board 500, together with the power module 300, is mounted to the heat exchanger 700, having one end edge of the control circuit board thermally connected to the heat exchanger 700. As figured, an air cooling type, which has a plurality of radiation fins, is adopted to the heat exchanger 700. However, when needed, a fan cooling type with an electric fan, etc. or a water cooling type may be adopted to the heat exchanger, wherein a further cooling of the power module 300 and the control circuit board 500 is made possible.

The capacitor 600, which is a smoothing capacitor, is connected to a direct current side of the power module 300 and stabilizes direct current voltage. An actual position for mounting the capacitor 600, as described hereinafter, may be different from what illustrated in FIG. 1.

Figure 2:
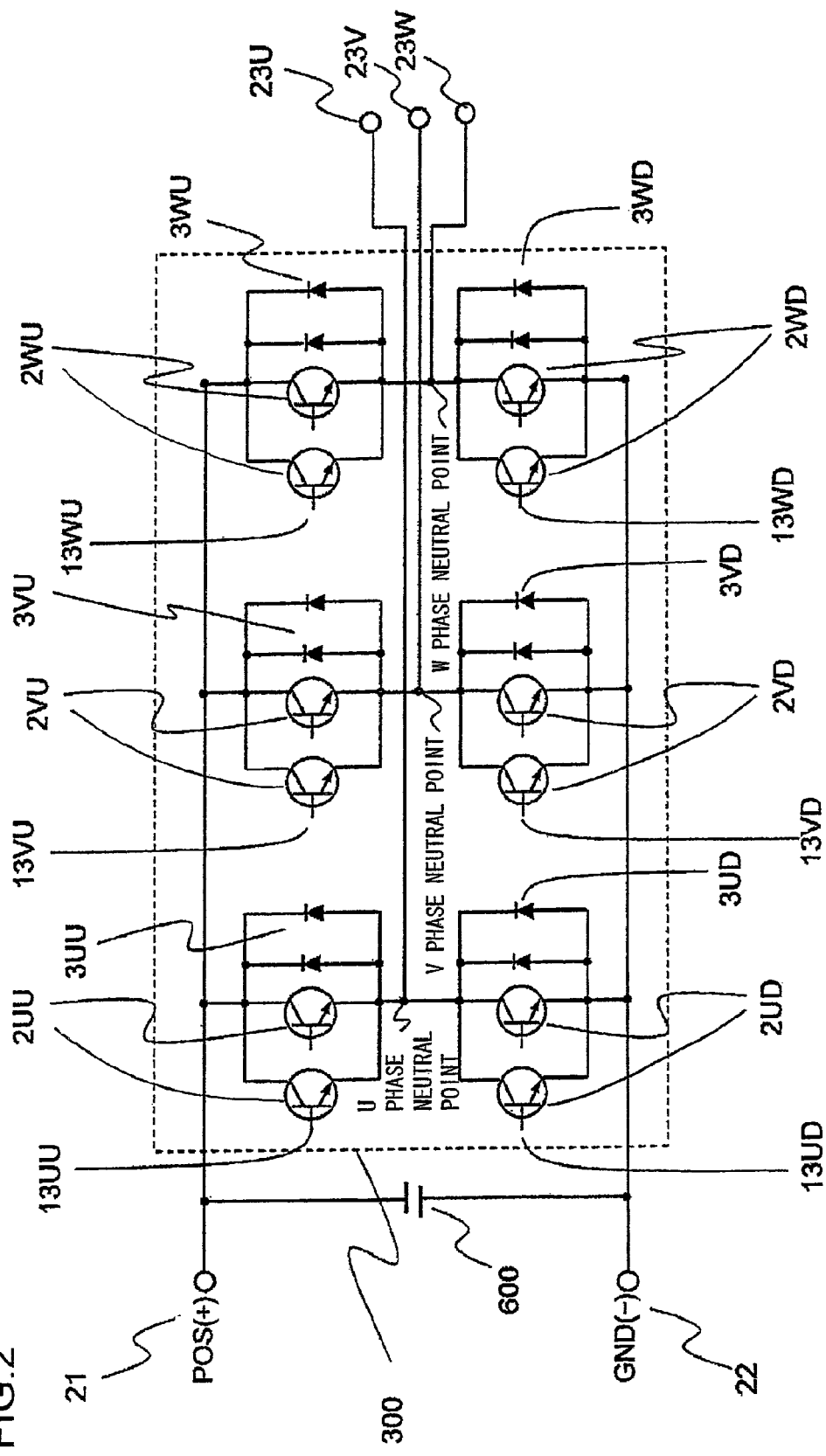
FIG. 2 is a circuit diagram of a power module in accordance with the embodiment of the present invention.

FIG. 2 is a circuit diagram of the power module 300, wherein an IGBT (Insulated Gate Bipolar Transistor) is used as a semiconductor switching device 2, and two devices connected in parallel are used for gaining necessary power capacity in accordance with the embodiment. Since the three-phase alternating current is employed in accordance with the embodiment, switching devices are provided to either upper arms and down arms of each of the phases, that is, U phase, V phase, and W phase. Here, 2UU represents the switching devices in the upper arm of the U phase; while, 2UD represents the switching devices in the down arm of the same. Similarly, the switching devices 2VU are provided in the upper arm of the V phase, and the switching devices 2VD are provided in the down arm of the same; the switching devices 2WU are provided in the upper arm of the W phase, and the switching devices 2WD are provided in the down arm of the same.

FWDs (Free Wheel Diodes) 3, which are connected in parallel in pair, are parallely connected to each of the switching devices. FWDs 3UU and 3UD are disposed in the upper arm and the down arm of the U phase, respectively. FWDs 3VU and 3VD are disposed in the upper arm and the down arm of the V phase, respectively. FWDs 3WU and 3WD are disposed in the upper arm and the down arm of the W phase, respectively.

As substitute for the switching devices 2 and the FWDs 3, MOS-FET (Metal Oxide Semiconductor Field Effect Transistor), which contains diodes in its device structure, may be employed as the power semiconductor devices.

Each collector electrode of the switching devices of the upper arm, 2UU, 2VU, and 2WU, is equally connected to a direct current positive terminal 21; while, each of emitter electrode of the same is connected to collector electrodes of the switching devices of the down arm, 2UD, 2VD, and 2WD respectively. Each of emitter electrodes of the switching devices of the down arm, 2UD, 2VD, and 2WD, is equally connected to a direct current negative terminal 22.

Consequently, a connecting point of the upper arm and the down arm of each phase, that is, each connecting point of the emitter electrodes of the switching devices of the upper arm and the collector electrodes of the switching devices of the down arm, is, as figured, a neutral point of each phase. The neutral point of the U phase arm is connected to an alternating current U phase terminal 23U; the neutral point of the V phase arm is connected to an alternating current V phase terminal 23V; and, the neutral point of the W phase arm is connected to an alternating current W phase terminal 23W.

With regard to the power module 300, direct current voltage is applied from a battery which is not herein figured to the direct current positive terminal 21 and the direct current negative terminal 22. The direct current voltage is stabilized due to an smoothing effect of the capacitor 600, which is connected to the power module 300.

Drive signals outputted from a drive circuit which is not herein figured are applied to each of the switching devices 2 via each of control pins 13UU, 13UD, 13VU, 13VD, 13WU and 13WD to cause each of the switching devices to be on/off controlled. Through PWN (Pulse Width Modulation) control, which is typical for this case, the alternating current terminals 23 (the alternating current U phase terminal 23U, the alternating current V phase terminal 23V, the alternating current W phase terminal 23W) are supplied with three-phase alternating current power at a predetermined frequency and a predetermined voltage.

As described above, switching devices and FWDs of each phase are configured to be the independent unit power module 100.

Figure 3:
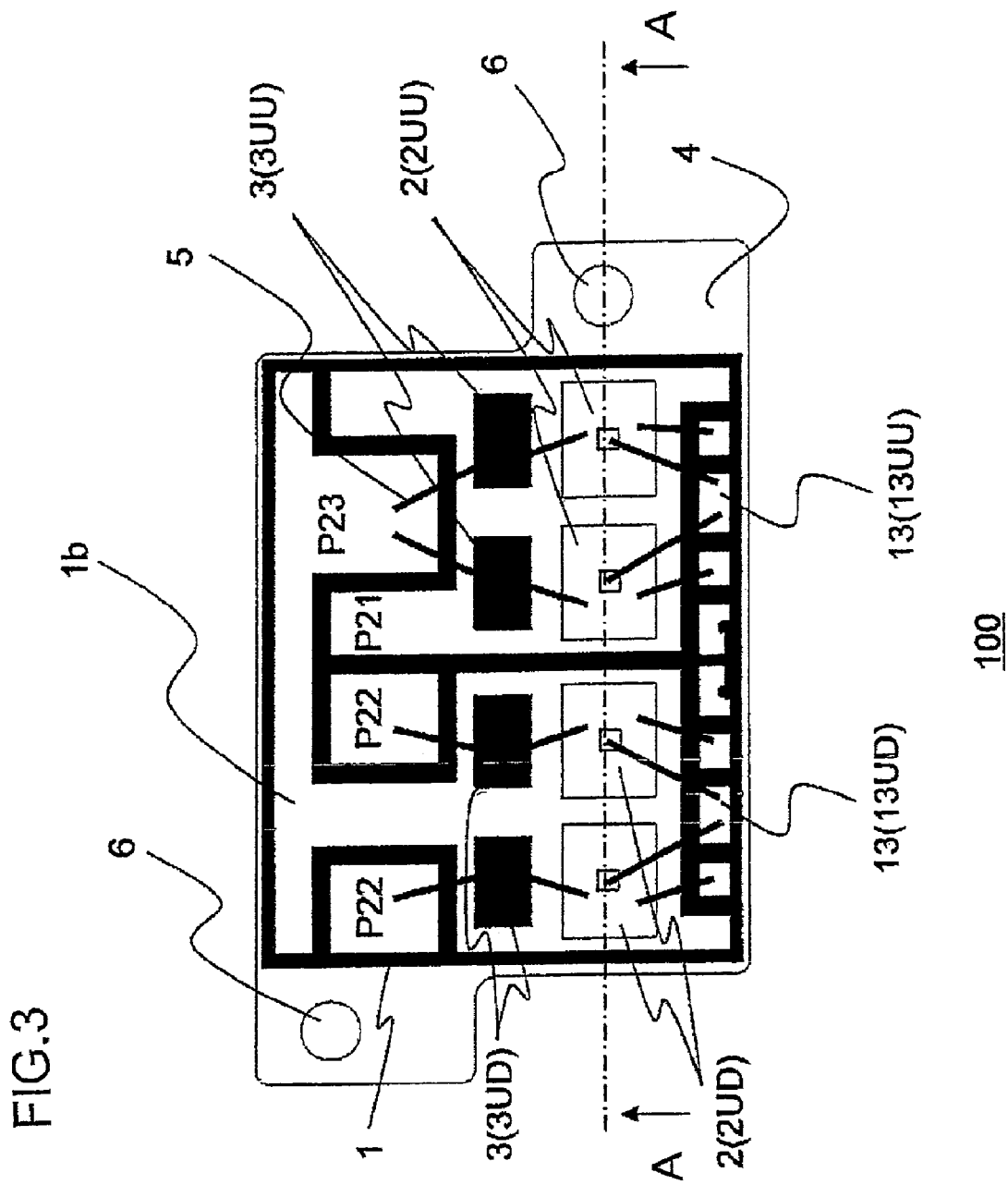
FIG. 3 is a plan view of a unit power module in accordance with the embodiment of the present invention.
Figure 4:
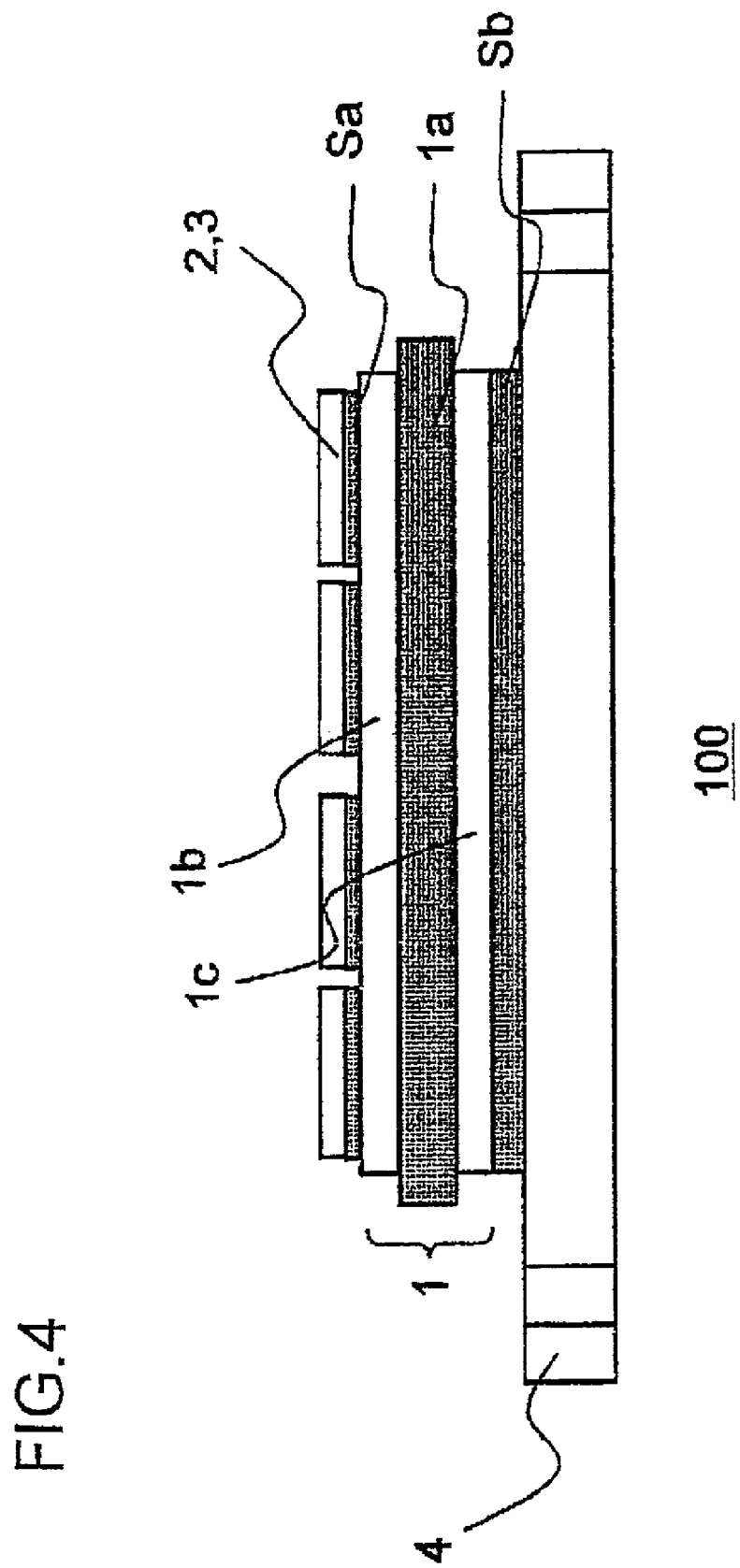
FIG. 4 is a cross-sectional view of the unit power module in accordance with the embodiment of the present invention.

The unit power module 100 will be described in detail with reference to FIG. 3 and FIG. 4. FIG. 4 is the cross-sectional view of the unit power module 100, being seen from arrows A, drawn in the plan view of FIG. 3.

The power module 100U of the U phase is hereby described on behalf of all the power modules 100 for convenience. It should be appreciated that what is described hereinafter is applicable to the power modules of other phases.

The power module 100U contains as a circuit board an insulated metal substrate 1 on which metal layers 1b and 1c are provided on both sides of an insulating plate 1a. The insulating plate 1a is made of insulating composite materials such as alumina ($Al_2O_3$), silicon nitride ($Si_3N_4$), aluminum nitride (AlN), etc. The metal layers 1b and 1c are mainly made of copper with plate processing on surfaces for soldering. The metal layer 1c is solder-mounted to a metal plate 4 with a soldering layer Sb. The metal plate 4 functions as a base for the unit power module, as well as a fixing element to a heat sink. Therefore, the metal plate 4 is made of metal such as copper, CIC, Al—SiC alloy, etc., and has a mounting hole 6 in a corner so as to be fixated to the heat exchanger 700 using screws, etc. for radiative cooling. Grease, etc. is usually applied in a gap for increasing thermal conductivity.

A conductive pattern is formed on the metal layer 1b of the insulated metal substrate 1. Then, the switching devices 2 (2UU and 2UD) and the FWD 3 (3UU and 3UD) are solder-mounted on a predetermined position of the pattern. As described above, two semiconductor devices and two diodes are provided for each one arm. The conductive pattern formed on the metal layer 1b includes, as illustrated in FIG. 3, three systems: a partial patter P21, a partial pattern P22, and a partial pattern P23. This allows, as illustrated in FIG. 3, the wiring pattern for the power system to be set up on the upper side of the drawing, and allows the connecting pattern for the signal system and terminals (control pins of each of the switching devices 2: 13UU, 13UD, 13VU, 13VD, 13WU, 13WD) to be set up on the down side of the drawing. As a result, the wiring connecting parts for the power system and the wiring connecting parts for the signal system are separated from each other on the insulated metal substrate 1 in accordance with the embodiment.

The partial pattern P21 is connected to the direct current positive terminal 21 shown in FIG. 2; and, the partial pattern P22, which exists at two places, is connected the direct current negative terminal 22; on the other hand, the partial pattern P23 is, in this case, connected to the alternating current U phase terminal 23U among the alternating current terminals 23. The collector terminals of the switching devices of the upper arm 2UU, as illustrated in FIG. 4 are solder-mounted to the partial pattern P21 with a soldering layer Sa. While, the emitter terminals of the switching devices of the upper arm 2UU are connected to the partial pattern P23 using bonding wires 5 via anode terminals of the FWDs 3UU. Cathode terminals of the FWDs 3UU are solder-mounted to the partial patter P21. Collector terminals of the switching devices of the down arm 2UD are solder-mounted to the partial pattern P23 with the soldering layer Sa (see FIG. 4). While, emitter terminals of the switching devices of the down are 2UD are connected to the partial pattern P22 using the bonding wires 5 via anode terminals of the FWDs 3UD. Cathode terminals of the FWDs 3UD are solder-mounted to the partial pattern P21.

Figure 5:
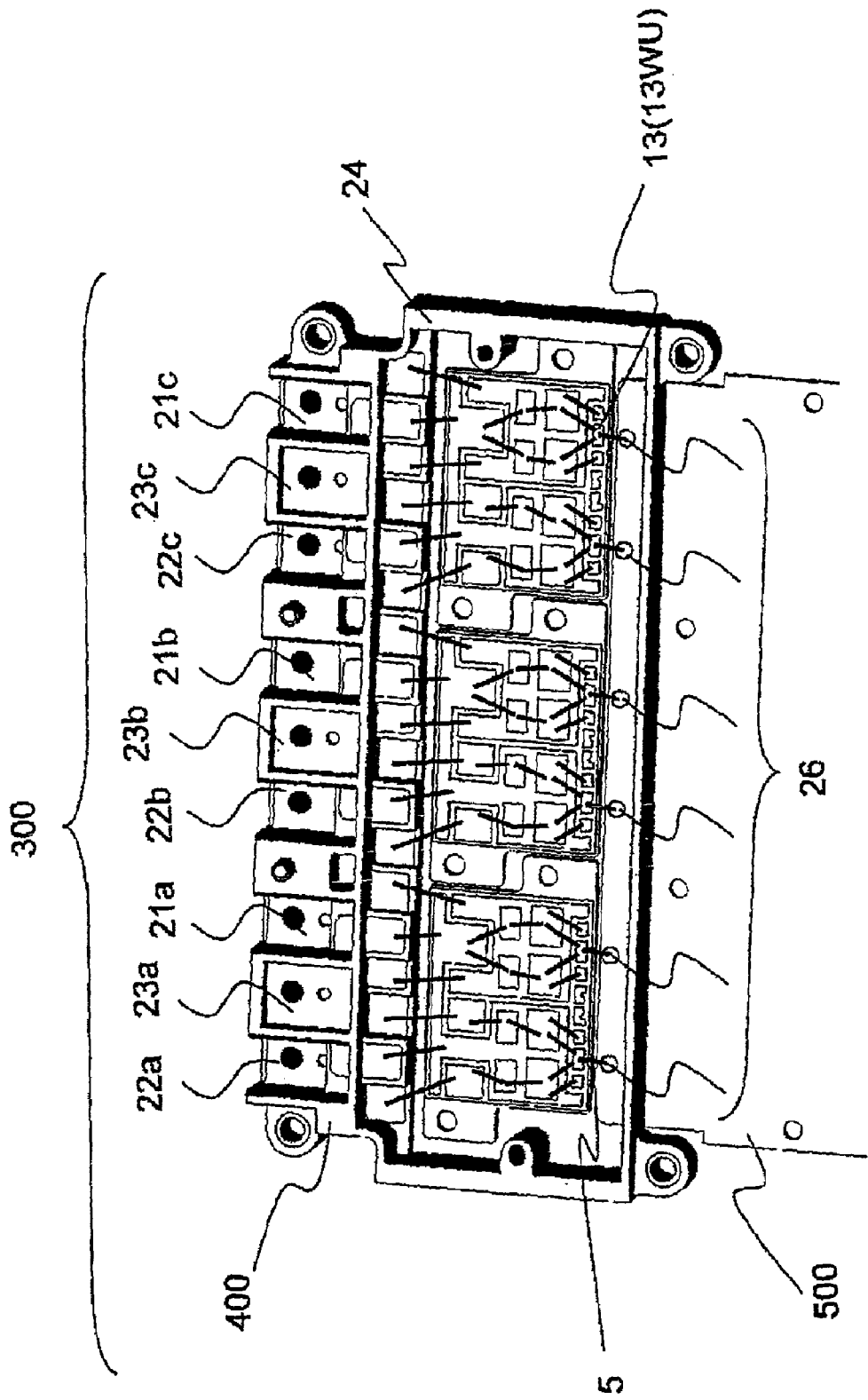
FIG. 5 is a plan view of the power module in accordance with the embodiment of the present invention.
Figure 6:
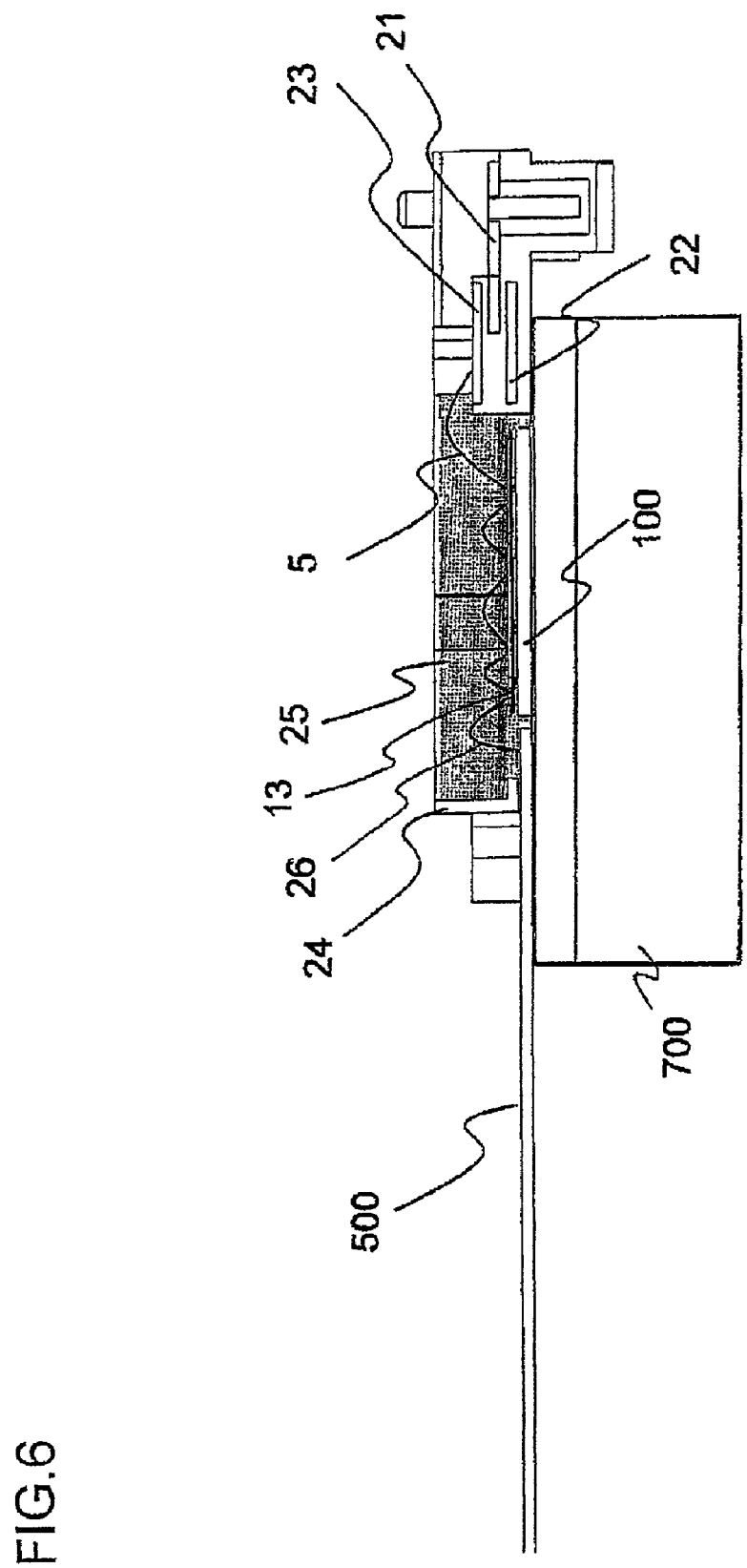
FIG. 6 is across-sectional view of the power module in accordance with the embodiment of the present invention.
Figure 7:
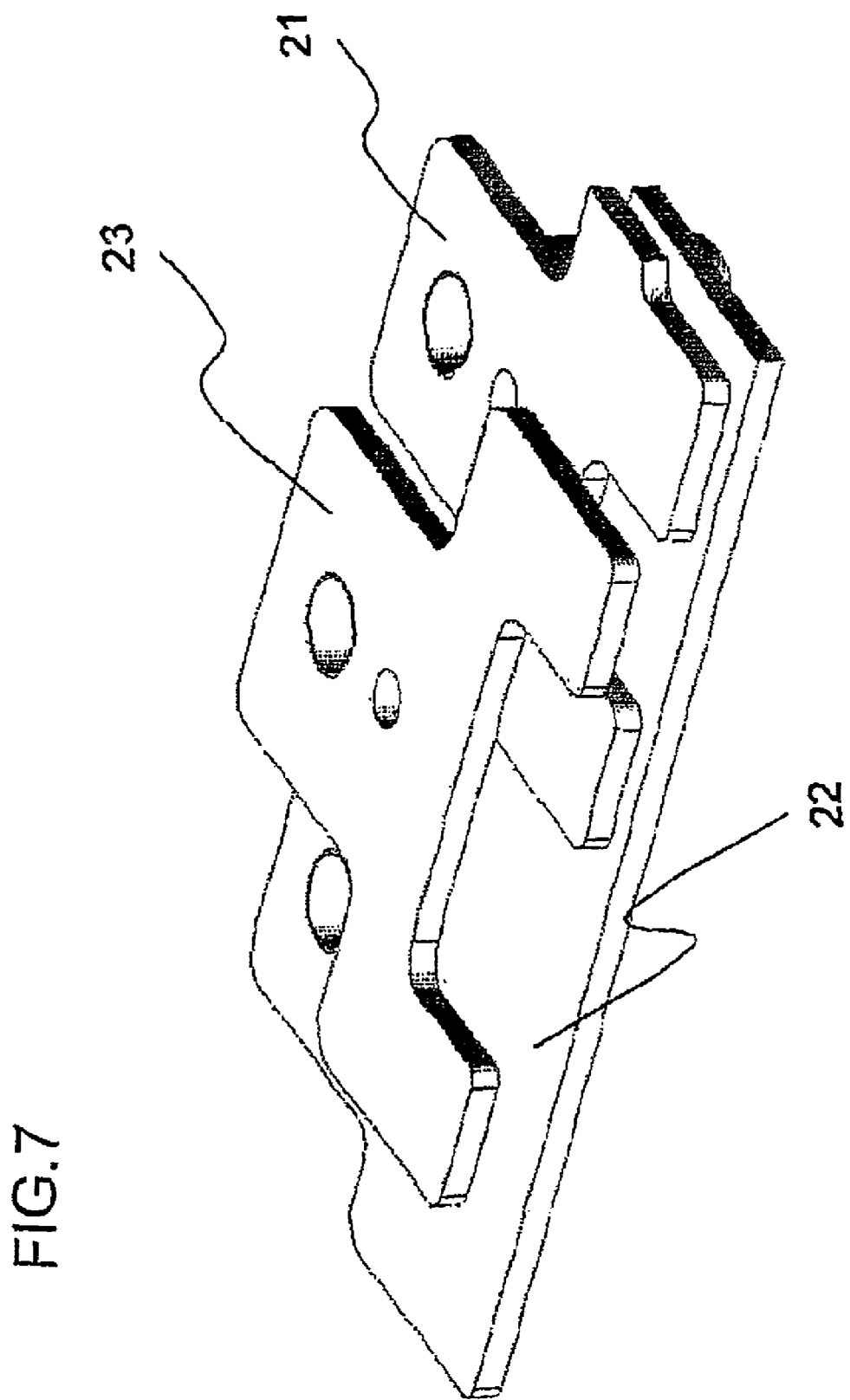
FIG. 7 is a perspective view of the terminals of the power module in accordance with the embodiment of the present invention.

The power module 300 in FIG. 1 will be described in detail with reference to FIG. 5 and FIG. 6. FIG. 6 is the cross-sectional view of the power module 300, being seen from arrows B, drawn in FIG. 8.

As described above, the power module 300 includes three phases of the unit power modules 100 contained in the power module case 400. As illustrated in FIG. 5, the power module case 400 has a resin case 24 in a planar shape of a substantial rectangle (rectangle, in this embodiment) as a main part, and contains three unit power modules 100 of three phases in the resin case 24. The direct current positive terminal 21, the direct current negative terminal 22, and the alternating current terminals 23 (the alternating current U phase terminal 23U, the alternating current V phase terminal 23V, and the alternating current W phase terminal 23W) are integrally-molded into one of four sides of the resin case 24 (herein figured as the upper side), using such resin as PPS, as described above.

The partial pattern P21, the partial pattern P22, and the partial pattern P23 of the power module 300 are respectively connected to the direct current positive terminal 21, the direct current negative terminal 22, and the three-phase alternating current terminals 23 of the resin case 24 using the bonding wires 5. FIG. 5 shows a direct current positive terminal 21a, a direct current negative terminal 22a, and a three-phase alternating current terminal 23a of the U phase unit power module 100U, a direct current positive terminal 21b, a direct current negative terminal 22b, and a three-phase alternating current terminal 23b of the V phase unit power module 100V, and a direct current positive terminal 21c, a direct current negative terminal 22c, and a three-phase alternating current terminal 23c of the W phase unit power module 100W. The direct current positive terminal 21, the direct current negative terminal 22, and the alternating current terminals 23 are configured to have the layer structure in which insulating materials are sandwiched for reducing wiring inductance, as illustrated in FIG. 6. The direct current positive terminal 21, the direct current negative terminal 22, and the alternating current terminals 23 are each formed into a bus bar in which the terminals are integrated, using such plate material as copper. It should be appreciated that, however, the configuration herein is given as one example only and is modifiable depending upon functionality.

The control pins (13UU, 13UD, 13VU, 13VD, 13WU, 13WD) of each of the unit power modules 100 are electrically connected to the gate signal output terminal 26 of the gate drive circuit board 500 using the wire bonding 5. Among the sides of the resin case 24, an opposite side (herein figured as the down side) of the above-described side at which the direct current positive terminal 21, the direct current negative terminal 22, and the alternating current terminals 23 are disposed is formed shorter in lower part, that is, the part which contacts with the heat exchanger 700 in FIG. 6, than that of other sides. Among the end edges of the gate drive circuit board 500, the end edge at which the gate signal output terminals 26 are set up is inserted into a space formed by shortening the lower part of the opposite side to meet the end edge at which the control pins 13 of each of the unit power modules 100 are provided. By this way, the control circuit board 500 that includes the gate drive circuit is retained.

The resin case 24 is filled with insulating resin 25 for sealing and for protecting the devices mounted on the power module 300, the bonding wires 5, and the electrical connecting parts between the power module 300 and the bonding wires 5. Silicone gel is usually employed for the resin.

Since both the resin case 24 and the control circuit board 500 that includes the gate drive circuit have threaded holes, these are to be fixated to the heat exchanger 700 using screws and to be mounted on a chassis of an equipment which is not herein figured. The control circuit board 500 that includes the gate drive circuit and the heat exchanger 700 may be configured to be bonded together.

The patent document 2 discloses, for example, electrical connecting pins protruded from a resin case for a connection to a gate board. On the other hand, as described with reference to FIG. 5 and FIG. 6, the control pins of the switching devices and the gate board are connected to each other through wire bonding in accordance with the embodiment.

In accordance with the embodiment, since any electrical connecting pin is unnecessary, the burden of soldering the electrical connecting pins is removed, and man-hours and costs are reduced. Since soldering on the back side of the board is unnecessary, reliability degradation, which often becomes an issue on soldering, is also removed. The elimination of the electrical connecting pins has been proven to enable a reduction in size by 10%.

Figure 8:
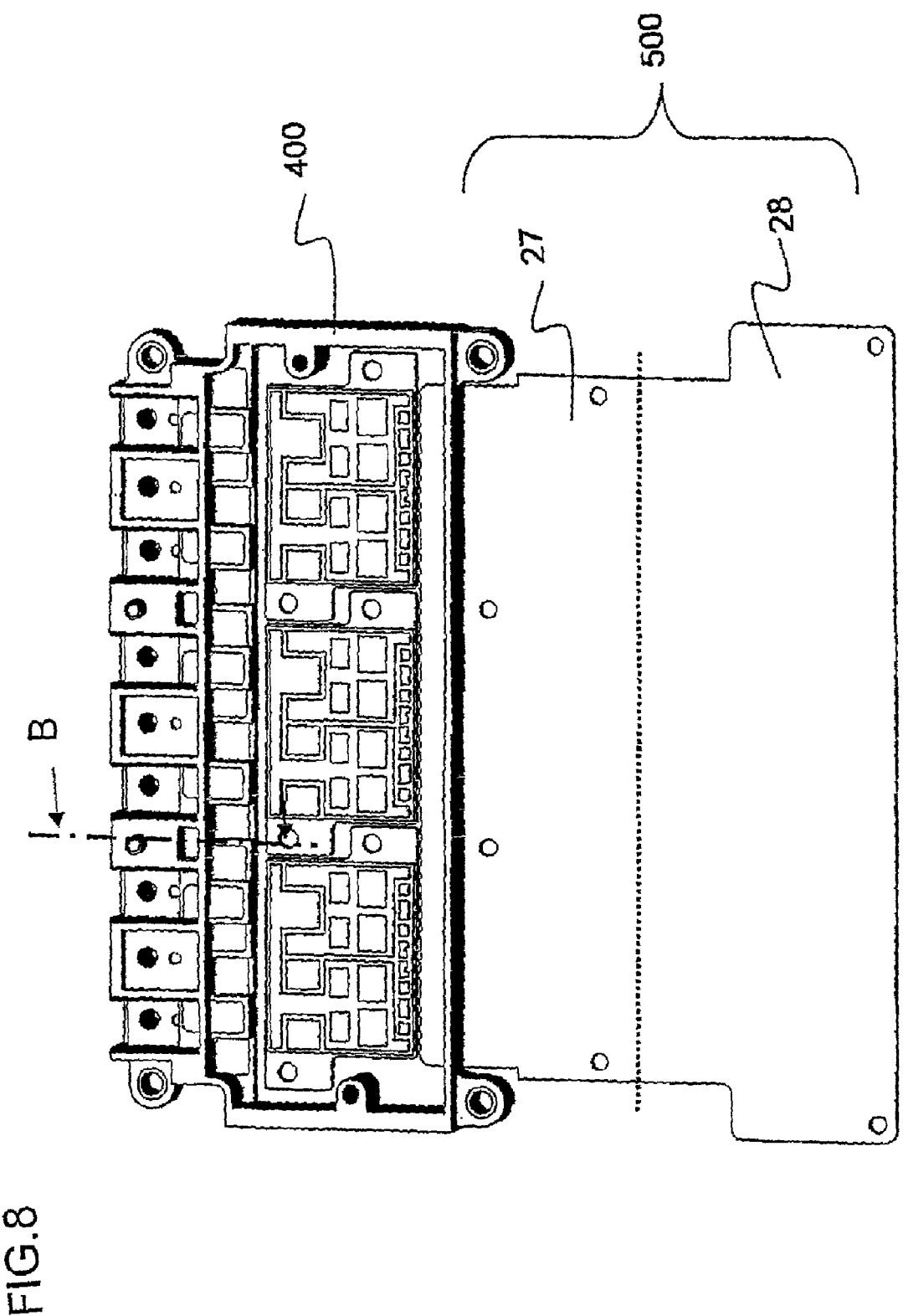
FIG. 8 is an illustration of a gate drive circuit board in accordance with the embodiment of the present invention.

With reference to FIG. 8, two types of circuits are usually mounted on the control circuit board 500: the gate drive circuit and a motor control circuit. The gate drive circuit is typically for power electric systems, and therefore is resistant to noise, even rather closer to be noise source itself; on the other hand, the motor control circuit is typically for low voltage electric systems (signal systems), and is susceptible to noise. In accordance with the embodiment, as illustrated in FIG. 8, the gate drive circuit 27 is mounted on the gate drive circuit board 500 on a side of the end edge which contacts with the end edge at which the control pins 13 of the power module 300 are provided; meanwhile, the motor control circuit 28 is mounted on the gate drive circuit board 500 on a side of the opposite end edge.

In accordance with the embodiment, therefore, the gate drive circuit 27 and the motor control circuit 28 are distinctly isolated on the control circuit board 500. The gate drive circuit 27 is placed on the power module 300 side; while, the motor control circuit 28 is placed on the other side. Consequently, even though they are mounted on the single board, high EMC (Electro-Magnetic Compatibility) is realized as a whole. As described above, the side on which the gate drive circuit 27 of the gate drive circuit board 500 is mounted contacts directly with the heat exchanger 700. The circuit of the power system side, whose heat release is relatively great, is subject to radiation effectively in accordance with the embodiment.

The capacitor 600 will be described in accordance with the embodiment.

Figure 9:
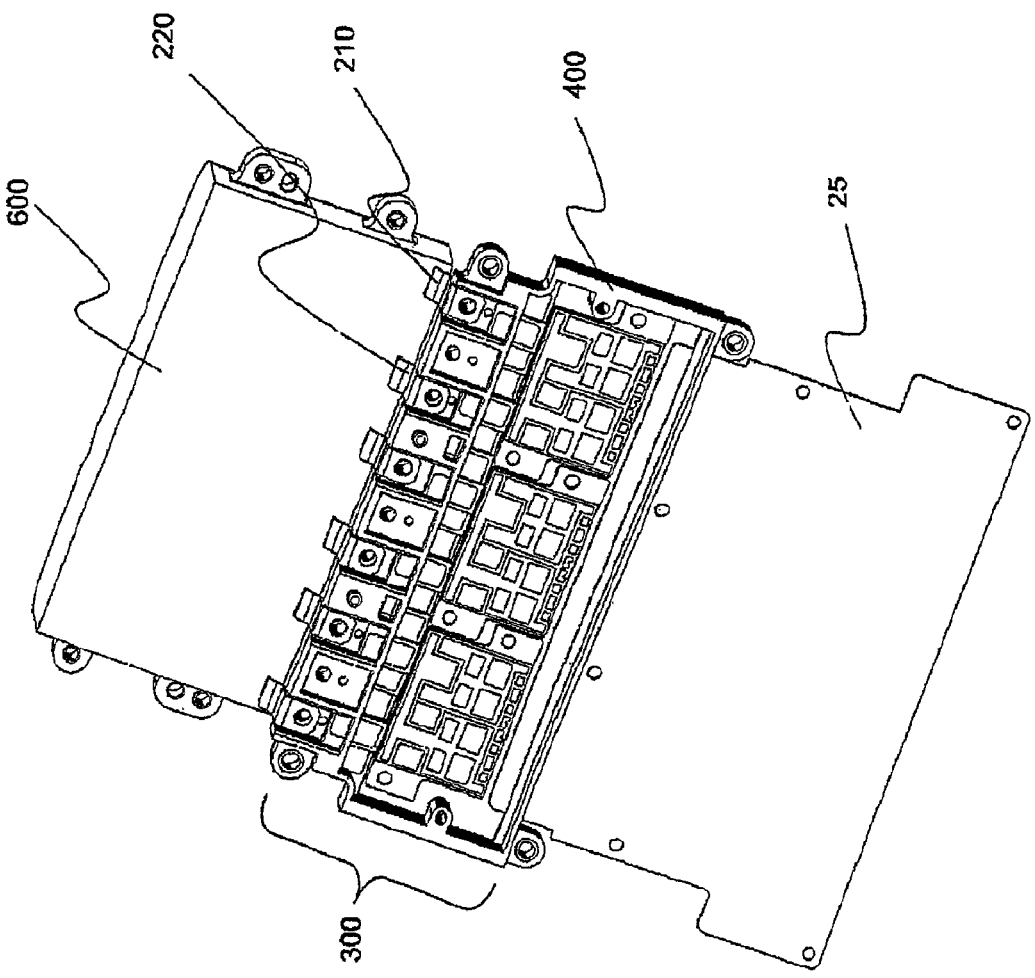
FIG. 9 illustrates an example of mounting a capacitor.

FIG. 9 illustrates an embodiment in which the capacitor 600 is provided at the end edge where the direct current positive terminals 21, the direct current negative terminals 22, and the alternating current terminals 23 of the power module 300 are provided, in substantially parallel with the power module 300. Positive terminals 210 and negative terminals 220 of the capacitor 600 are fixated respectively to the direct current positive terminals 21 and the direct current negative terminals 22 of the power module 300 using screws, etc.

Three of the positive terminals 210 and three of the negative terminals 220 of the capacitor 600 are provided in accordance with the direct current positive terminals 21 and the direct current negative terminals 22 of the U phase, V phase, and W phase of the power module 300. Each terminal is connected in parallel with the terminal of same phase in the capacitor 600. In accordance with the embodiment, impedance control at the terminals of the capacitor 600, combined with the integrated formation of the bus bar at the terminals, is gained enough for increasing the smoothing function of the capacitor 600 and being effective in noise reduction.

The patent document 3 discloses, for example, a capacitor to be provided directly underneath a power module case. In accordance with the embodiment, however, the capacitor 600 is to be provided outside the power module case 400. This allows the capacitor to be exchanged easily at the time of, for example, deterioration of the capacitor 600; improves the reliability; and reduces the operating cost. Either of a film capacitor and an electrolytic capacitor may be applied as the capacitor 600.

Figure 10:
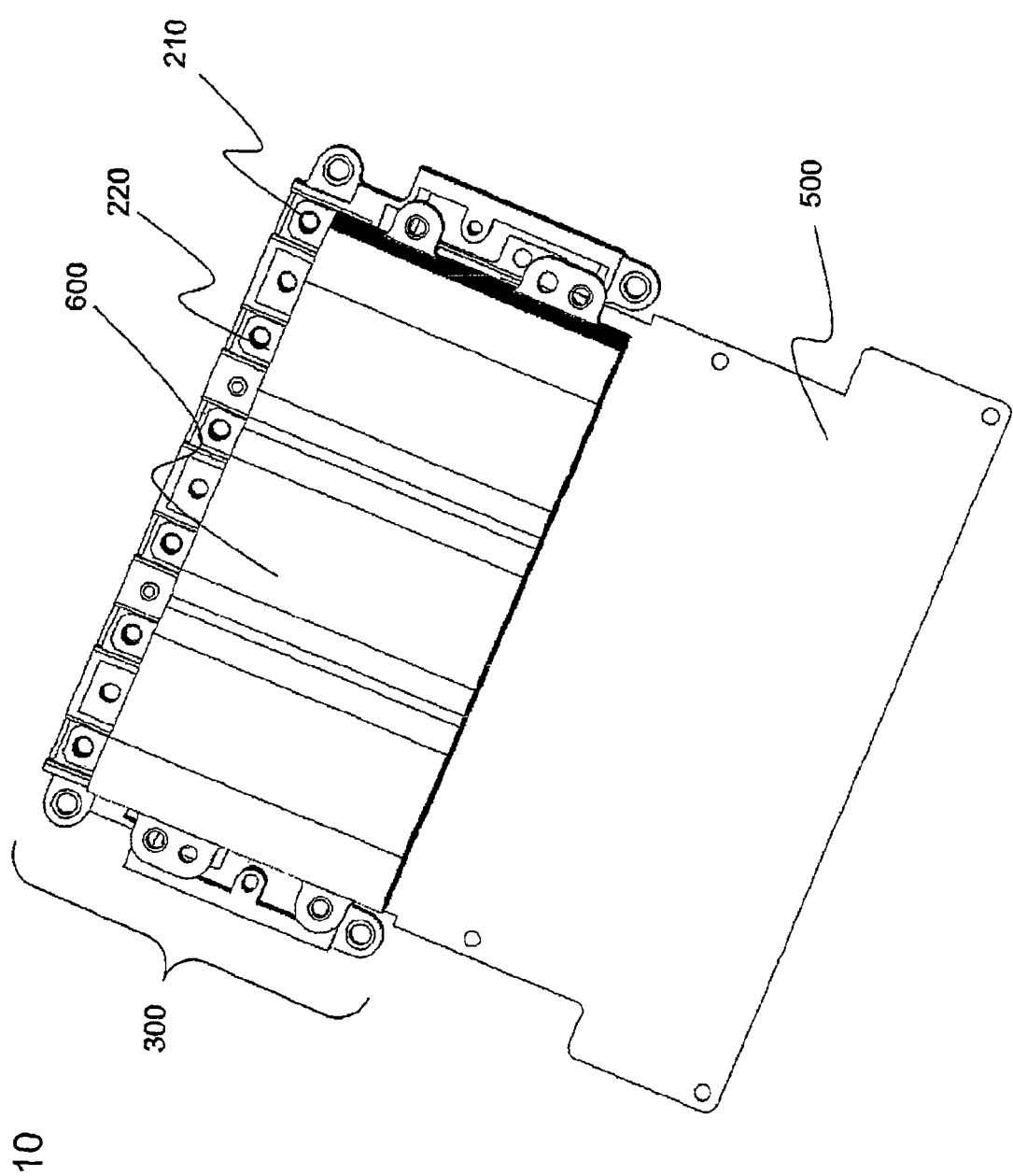
FIG. 10 illustrates another example of mounting a capacitor in accordance with the embodiment of the present invention.

FIG. 10 shows an embodiment in which the capacitor 600 is mounted on the power module 300, wherein the positive terminals 210 and the negative terminals 220 of the capacitor 600 are fixated respectively to the direct current positive terminals 21 and the direct current negative terminals 22 of the power module 300 using screws, etc. The setup is easily done simply by modifying the way of bending the positive terminals 210 and negative terminals 220. According to the present invention, a position of the capacitor 600 is easily modifiable in response to a required shape for the power converter device 200. As a result, the power converter device 200 with wide flexibility for a variety of shapes is realized.

In accordance with the embodiment, which is described above, the following operational effects can be achieved.
(1) The power part's pattern and the signal part's pattern are isolated on the insulating substrate.
(2) Due to the above (1), all the power terminals are provided on one side (the side of the power part), while the control board is provided on the other side.
(3) Due to the above-mentioned (1) and (2), reduction in size and simplification in the power bus bar are realized.
(4) Low inductance, high EMC, and noise reduction are realized by simplification in wiring of the power bus bar.
(5) The gate pins for connecting the power part and the gate of the control circuit board are removed.
(6) Slimness is realized due to removal of the double layer structure in the power module and the control circuit board.
(7) The gate pins are removed by employing the single layer structure and the easy wire bonding connection is realized.
(8) The single layer structure allows hot parts of the gate drive circuit to be set up on the base, and realizes cooling function.
(9) The capacitor is provided on the top or side of the power bus bar, instead of underneath the power bus bar.
(10) Due to the above (9), the capacitor is easily exchangeable at the time of deterioration.
(11) Modifying the capacitor in shape and position allows a variety of shapes of inverter to be applied.
(12) The removal of the layer structure causes all the components to be visible from above.
(13) The removal of the layer structure causes the reduction in the number of the components.
(14) Both water cooling type and air cooling type are made applicable.

Figure 11:
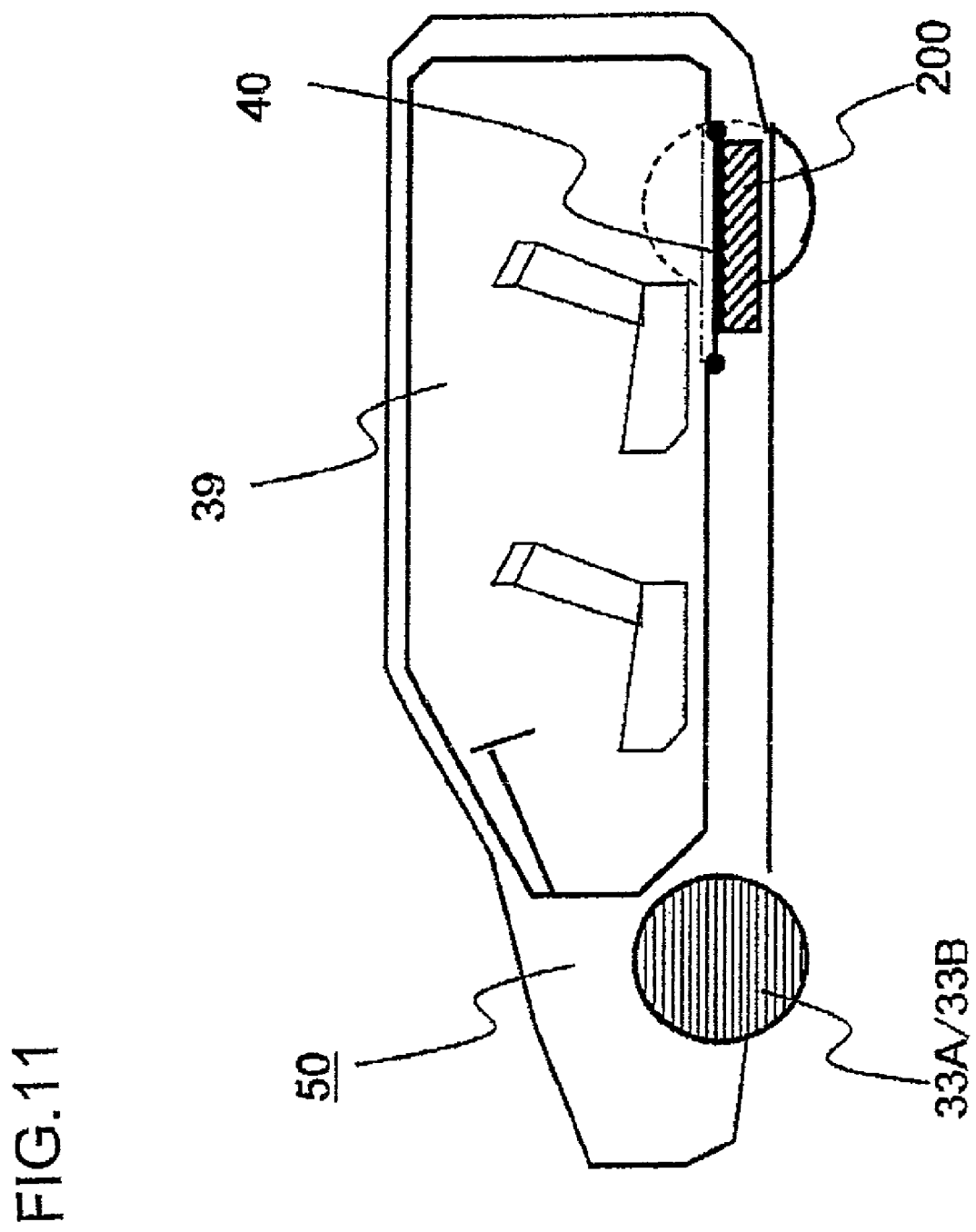
FIG. 11 illustrates an example of a vehicle in which the embodiment of the power converter device in accordance with the present invention is applied.
Figure 14:
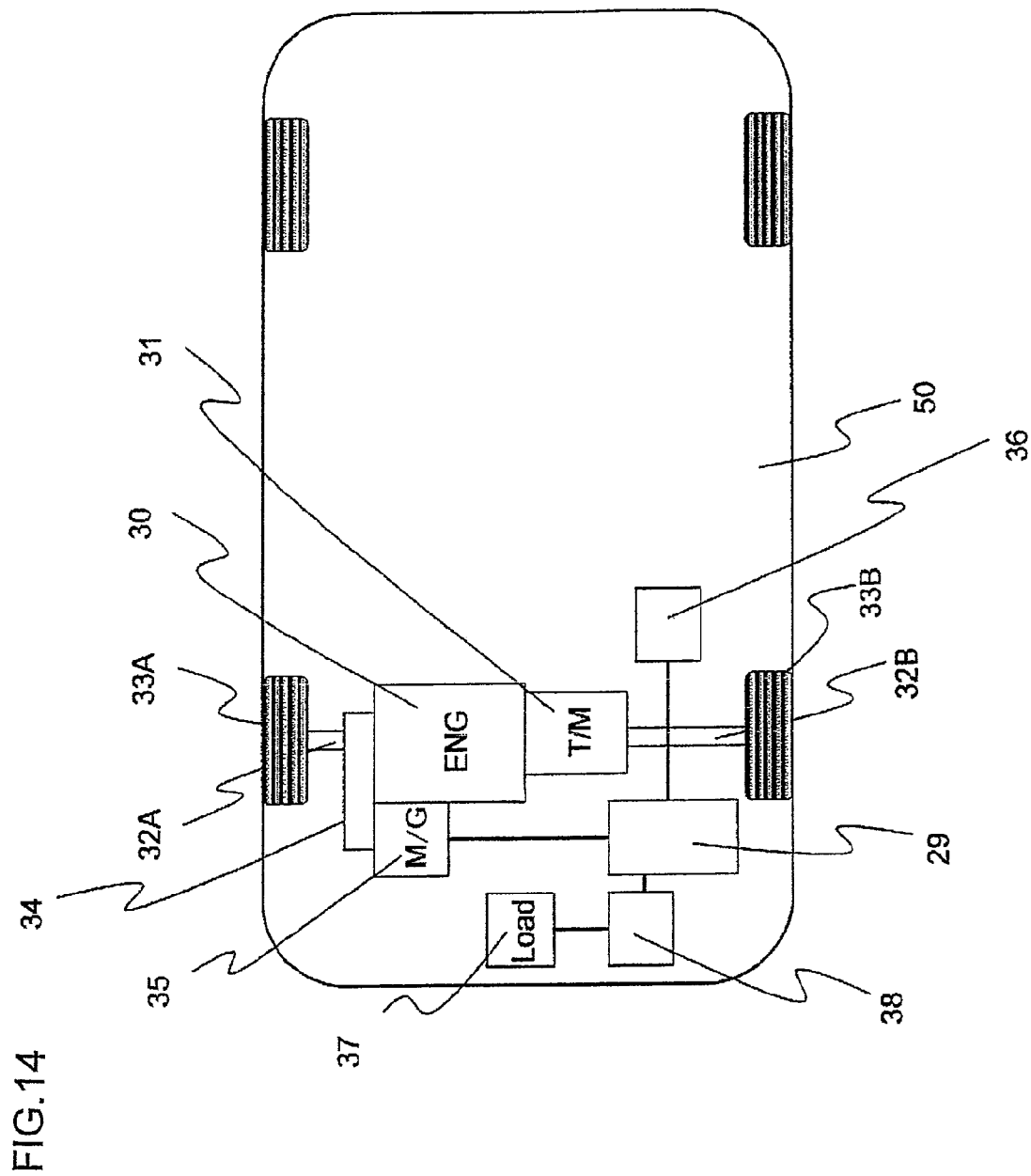
FIG. 14 illustrates an example of a hybrid car.
Figure 15:
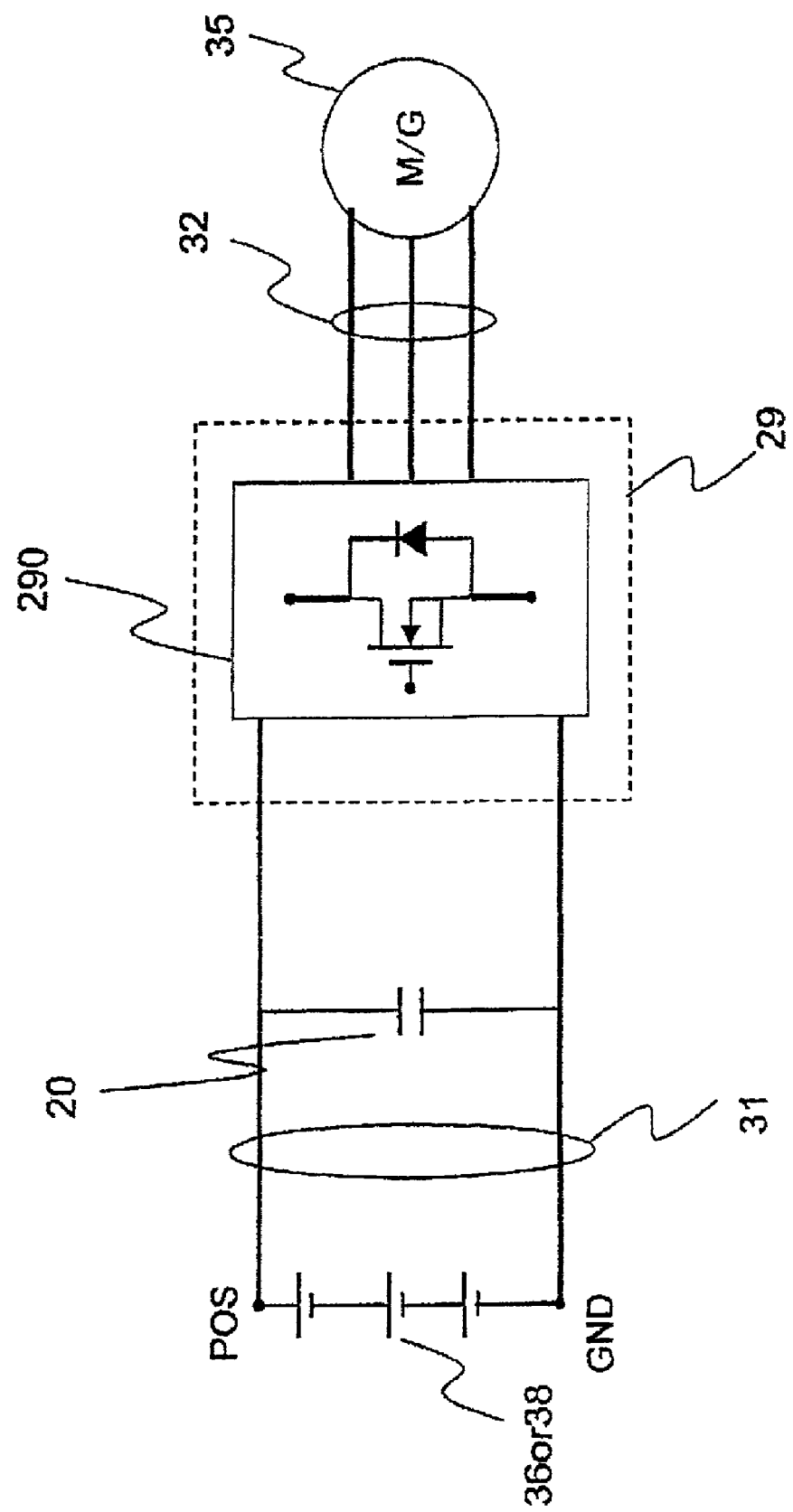
FIG. 15 is a circuit diagram in accordance with the example of the power converter device.

The power converter device according to the embodiment of the present invention is, as illustrated in FIG. 14, applicable to, for example, a hybrid car. Hereinafter, an embodiment in which the power converter device 200 according to the embodiment, is mounted on a vehicle will be described. FIG. 11 shows an embodiment in which the power converter device 200 is mounted underneath a floor of a vehicle interior 39 of a station wagon type hybrid car 50, wherein a floor lid 40 for maintenance protects the power converter device 200.

Figure 12:
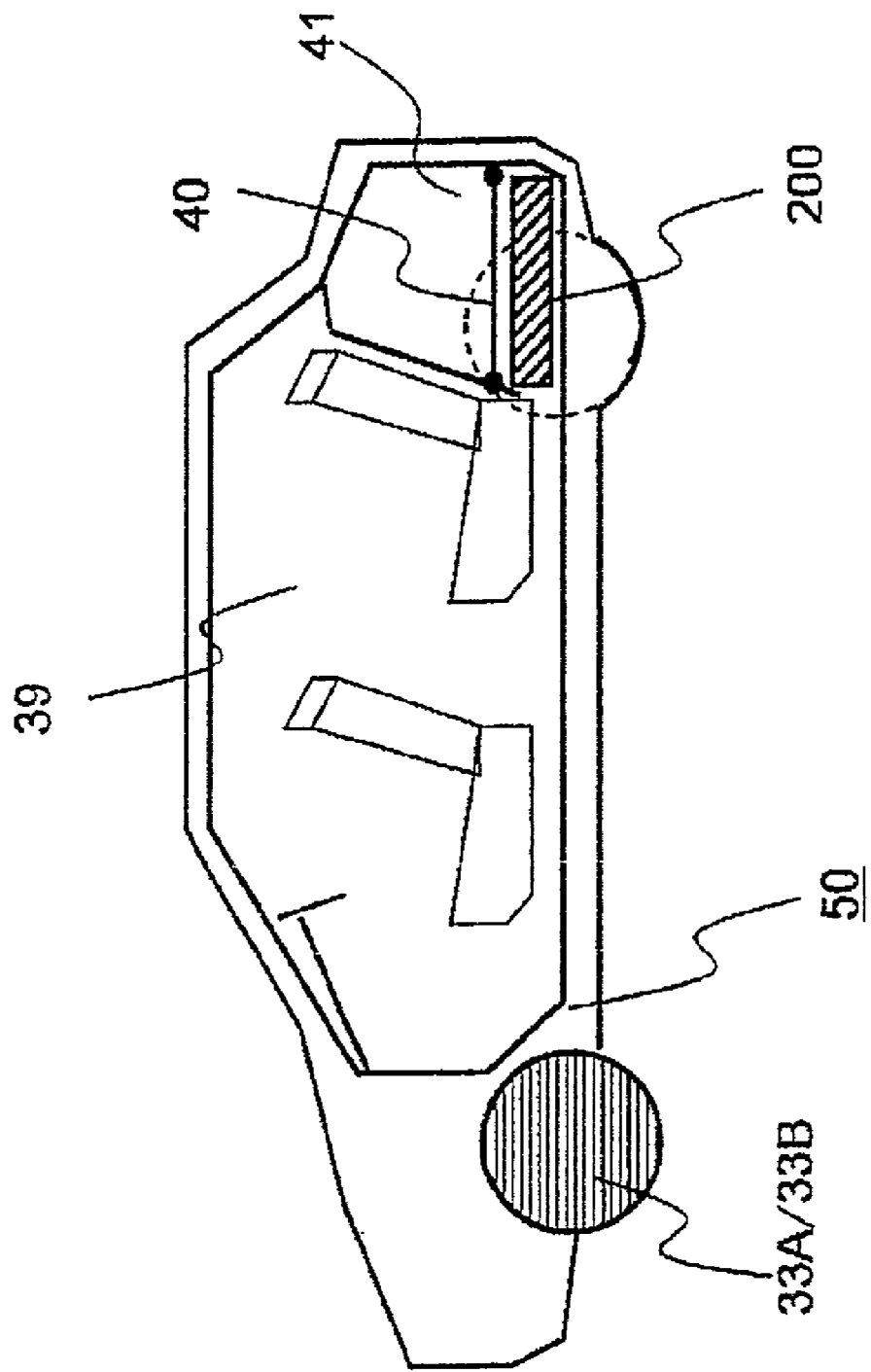
FIG. 12 illustrates another example of a vehicle in which the embodiment of the power converter device in accordance with the present invention is applied.

FIG. 12 shows an embodiment in which the power converter device 200 is mounted underneath a floor of a trunk 41 of a sedan type hybrid car 50, wherein the floor lid 40 for maintenance protects the power converter device 200.

Figure 13:
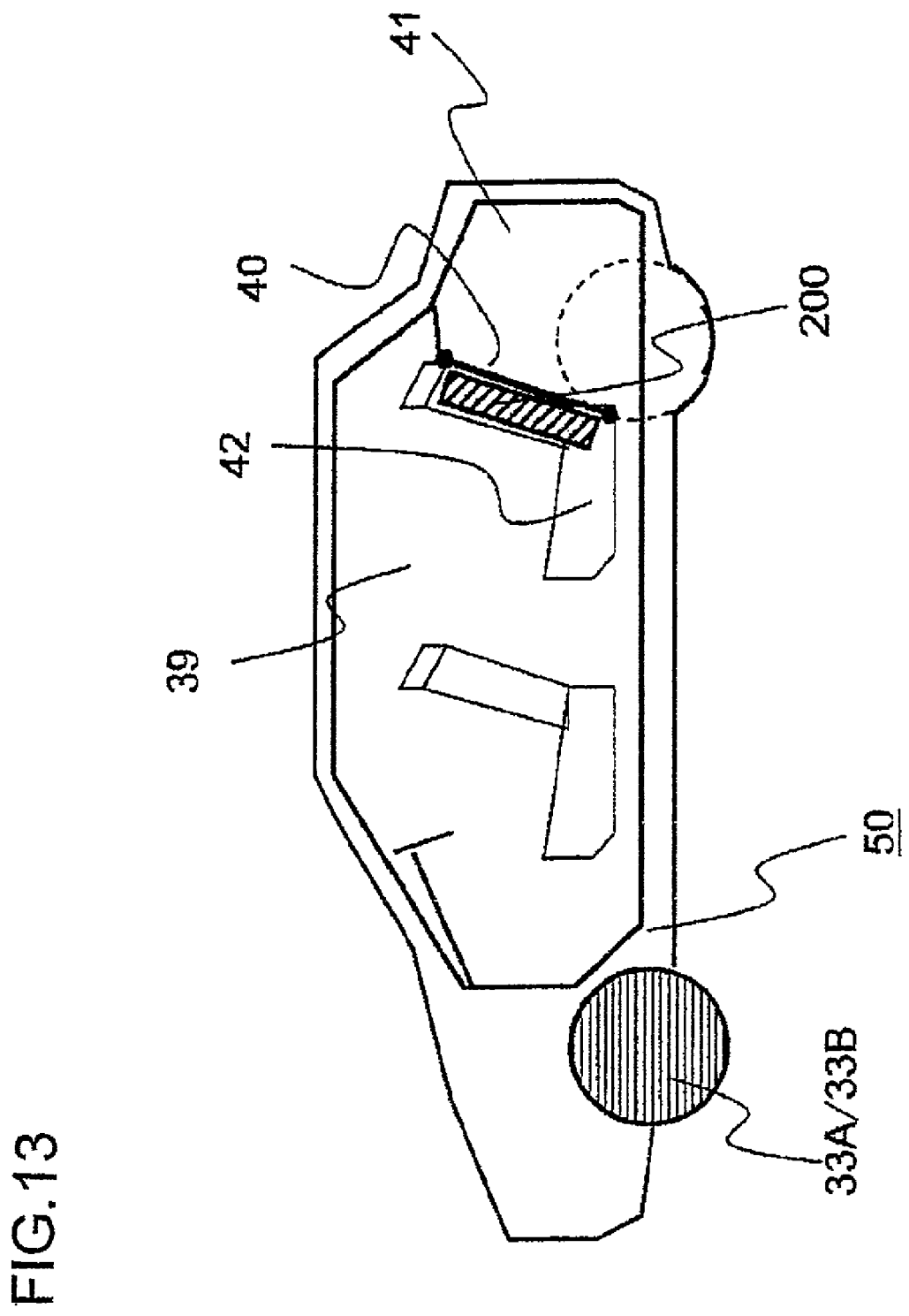
FIG. 13 illustrates yet another example of a vehicle in which the embodiment of the power converter device in accordance with the present invention is applied.

FIG. 13 shows an embodiment in which the power converter device 200 is provided in a backrest of a back seat 42, wherein a lid 40 for maintenance protects the power converter device 200. In accordance with the above embodiments, an available space of the vehicle is utilized effectively for mounting the power converter device 200, wherein space saving is realized.

The above-described embodiments are examples, and various modifications can be made without departing from the scope of the invention.

What is claimed is:

1. A power converter device that comprises:
a substantially rectangular power module on which a plurality of switching devices are mounted;
a substantially rectangular control circuit board on which a drive circuit of the switching devices is mounted;
a heat exchanger on which the power module is mounted; and
a smoothing capacitor, wherein:
the power module comprises a pair of positive and negative direct current terminals connected with the smoothing capacitor, a plurality of alternating current terminals for inputting and outputting polyphase alternating current, a plurality of control terminals for providing the switching devices with control signals, and a case that encloses the plurality of switching devices and the plurality of control terminals;
the direct current terminals and the alternating current terminals are set up in an array at a first side among four sides of the power module;
the control terminals are set up at a second side which is opposite to the first side of the power module;
the case comprises an inserting portion into which the control circuit board is inserted at a position corresponding to the second side of the power module;
the control circuit board comprises a gate signal output terminal at one of its end edges, and the end edge at which the gate signal output terminal is set up is inserted into the case through the inserting portion of the case and is placed next to the second side of the power module; and
the control terminals of the power module and the gate signal output terminal of the control circuit board are connected inside the case using bonding wires.

2. A power converter device according to claim 1, wherein the alternating current terminals are set up between the pair of positive and negative direct current terminals.

3. A power converter device according to claim 1, wherein the control circuit board is fixed to the heat exchanger using an adhesive agent.

4. A power converter device according to claim 2, wherein the pair of positive and negative direct current terminals and the alternating current terminals are, at least partially, configured in a layer structure.

5. A power converter device according to claim 1, wherein the bonding wires and a connecting part using the bonding wires, are sealed using an insulating resin.

6. A power converter device according to claim 1, wherein the switching devices are divided into each phase of polyphase alternating current to be configured as an unit power module of each phase.

7. A power converter device according to claim 6, wherein each of the unit power modules comprises a wiring connecting section of a power system and a wiring connecting section of a signal system, which are isolated on an insulated metal substrate.

* * * * *